(12) United States Patent
Liu et al.

(10) Patent No.: US 10,141,652 B2
(45) Date of Patent: Nov. 27, 2018

(54) ANTENNA APPARATUS AND DEVICE (71) Applicant: Huawei Technologies Co., Ltd., Shenzhen (CN)

(72) Inventors: Qing Liu, Shenzhen (CN); Yuzhen Zhang, Wuhan (CN); Yao Lan, Shenzhen (CN); Dingjie Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 38 days.

(21) Appl. No.: 15/507,313

(22) PCT Filed: Aug. 28, 2014

(86) PCT No.: PCT/CN2014/085401
§ 371 (c)(1),
(2) Date: Feb. 28, 2017

(87) PCT Pub. No.: WO2016/029404
PCT Pub. Date: Mar. 3, 2016

(65) Prior Publication Data
US 2017/0288310 A1 Oct. 5, 2017

(51) Int. Cl.
*H01Q 9/04* (2006.01)
*H01Q 9/42* (2006.01)
(Continued)

(52) U.S. Cl.
CPC ...... *H01Q 9/0421* (2013.01); *B32B 38/1841* (2013.01); *H01L 21/67144* (2013.01);
(Continued)

(58) Field of Classification Search
CPC ...... H01Q 9/0421; H01Q 5/335; H01Q 5/342; B32B 38/1841; H01L 21/67144
See application file for complete search history.

(56) References Cited

U.S. PATENT DOCUMENTS

2006/0250310 A1 11/2006 Yeh et al.
2011/0181487 A1 7/2011 Kim et al.
(Continued)

FOREIGN PATENT DOCUMENTS

CN 101425619 A 5/2009
CN 101465465 A 6/2009
(Continued)

OTHER PUBLICATIONS

Foreign Communication From a Counterpart Application, European Application No. 14900869.0, Extended European Search Report dated Jul. 18, 2017, 8 pages.
(Continued)

*Primary Examiner* — Dameon E Levi
*Assistant Examiner* — David Lotter
(74) *Attorney, Agent, or Firm* — Conley Rose, P.C.

(57) ABSTRACT

An antenna apparatus includes: an antenna radiator, at least one antenna cable trough, a feedpoint, and at least one first protruding metal strip; where the at least one antenna cable trough is disposed on the antenna radiator; the at least one antenna cable trough extends along a top edge to a bottom edge of the antenna radiator; the feedpoint is further disposed on the antenna radiator, and the feedpoint is disposed at an end of the bottom edge of the antenna radiator and is near a side edge of the antenna radiator; and the at least one first protruding metal strip is inserted in the antenna cable trough and is separated from the antenna radiator.

11 Claims, 5 Drawing Sheets (51) Int. Cl.
  *H01Q 5/371*   (2015.01)
  *H01Q 5/378*   (2015.01)
  *H01Q 5/335*   (2015.01)
  *H01Q 5/342*   (2015.01)
  *B32B 38/18*   (2006.01)
  *H01L 21/67*   (2006.01)
  *H01Q 1/52*    (2006.01)

(52) U.S. Cl.
  CPC ............ *H01Q 5/335* (2015.01); *H01Q 5/342* (2015.01); *H01Q 5/371* (2015.01); *H01Q 5/378* (2015.01); *H01Q 9/42* (2013.01); *H01Q 1/52* (2013.01)

(56) References Cited

U.S. PATENT DOCUMENTS

| | | | |
|---|---|---|---|
| 2012/0001815 A1 | 1/2012 | Wong et al. | |
| 2012/0026064 A1* | 2/2012 | Lee | H01Q 9/16 343/860 |
| 2014/0009354 A1 | 1/2014 | Badaruzzaman et al. | |
| 2015/0097752 A1* | 4/2015 | Li | H01Q 1/38 343/848 |
| 2018/0053990 A1* | 2/2018 | Caballero | H04M 1/0202 |

FOREIGN PATENT DOCUMENTS

| | | |
|---|---|---|
| CN | 103545597 A | 1/2014 |
| CN | 103915682 A | 7/2014 |
| EP | 2615684 A2 | 7/2013 |
| EP | 3001503 A1 | 3/2016 |

OTHER PUBLICATIONS

Foreign Communication From a Counterpart Application, PCT Application No. PCT/CN2014/085401, English Translation of International Search Report dated May 29, 2015, 2 pages.

Foreign Communication From a Counterpart Application, PCT Application No. PCT/CN2014/085401, English Translation of Written Opinion dated May 29, 2015, 6 pages.

* cited by examiner

ANTENNA APPARATUS AND DEVICE

CROSS-REFERENCE TO RELATED APPLICATIONS

This application is a national stage application of international patent application number PCT/CN2014/085401 filed on Aug. 28, 2014, which is incorporated by reference.

TECHNICAL FIELD

Embodiments of the present disclosure relate to communications technologies, and in particular, to an antenna apparatus and a device.

BACKGROUND

As communications technologies develop, various wireless terminal products are increasingly popularly used. When enjoying various conveniences brought by wireless communications devices, the public also gradually impose higher requirements on portability of a terminal, that is, the terminal is increasingly small in size. As a significant part of a terminal product, an antenna is necessarily developing toward miniaturization and needs to support multiple frequency bands in a global market. In addition, application of a Long-Term Evolution (LTE) multiple-input multiple-output MIMO) technology also requires integration of multiple antennas in a single terminal. Therefore, how to implement a miniaturized and high bandwidth antenna becomes a challenge in the industry.

In a current printed circuit board (PCB) antenna technology, a relatively small size results in relatively narrow bandwidth and cannot meet a requirement of covering high bandwidth.

SUMMARY

Embodiments of the present disclosure provide an antenna apparatus and a device to resolve a problem of how a miniaturized antenna can cover high bandwidth.

According to a first aspect, an embodiment of the present disclosure provides an antenna apparatus that includes: an antenna radiator, at least one antenna cable trough, a feedpoint, and at least one first protruding metal strip; the at least one antenna cable trough is disposed on the antenna radiator; the at least one antenna cable trough extends along a top edge to a bottom edge of the antenna radiator; the feedpoint is further disposed on the antenna radiator, and the feedpoint is disposed at an end of the bottom edge of the antenna radiator and is near a side edge of the antenna radiator; and the at least one first protruding metal strip is inserted in the antenna cable trough and is separated from the antenna radiator.

In a first possible implementation manner of the first aspect, the apparatus further includes at least one second protruding metal strip; the at least one second protruding metal strip is disposed on another side edge, far away from the feedpoint, of the antenna radiator; the at least one second protruding metal strip is separated from the antenna radiator; and an end of the at least one second protruding metal strip points to the another side edge of the antenna radiator.

According to a second aspect, an embodiment of the present disclosure provides a device that includes a printed circuit board PCB and an antenna apparatus; where the antenna apparatus is disposed in a position near an edge of the PCB, a PCB metal layer is disposed around the antenna apparatus, and the PCB metal layer is on the PCB; the antenna apparatus includes: an antenna radiator, at least one antenna cable trough, a feedpoint, and at least one first protruding metal strip; the at least one antenna cable trough is disposed on the antenna radiator; the at least one antenna cable trough extends along a top edge to a bottom edge of the antenna radiator; the feedpoint is further disposed on the antenna radiator, and the feedpoint is disposed at an end of the bottom edge of the antenna radiator and is near a side edge of the antenna radiator; the side edge of the antenna radiator is near the edge of the PCB; the feedpoint connects the antenna radiator and the PCB metal layer; the at least one first protruding metal strip is inserted in the antenna cable trough and is separated from the antenna radiator; and an end of the at least one first protruding metal strip is connected to the PCB metal layer.

In a first possible implementation manner of the second aspect, the antenna apparatus further includes at least one second protruding metal strip; the at least one second protruding metal strip is disposed on another side edge, far away from the feedpoint, of the antenna radiator; the at least one second protruding metal strip is separated from the antenna radiator; an end of the at least one second protruding metal strip points to the antenna radiator; and the other end of the at least one second protruding metal strip is connected to the PCB metal layer.

With reference to the second aspect or the first possible implementation manner of the second aspect, in a second possible implementation manner of the second aspect, at least one PCB trough is disposed in a position opposite to an opening of the antenna cable trough, and the at least one PCB trough is disposed on the PCB metal layer.

In the antenna apparatus and the device that are provided in the embodiments of the present disclosure, at least one antenna cable trough is disposed on an antenna radiator, and the at least one antenna cable trough can extend a path along which a current flows on the antenna radiator, and shift a low-frequency resonance point of an antenna toward a lower frequency. In this way, in a case of a determined frequency band, a size of the antenna can be reduced to achieve miniaturization. A feedpoint is disposed in a position that is at an end of a bottom edge of the antenna radiator and that is near a side edge of the antenna radiator. In addition, at least one first protruding metal strip is disposed in the antenna cable trough, and the at least one first protruding metal strip can enable the antenna to generate a new resonance point in a high frequency band, so as to widen a frequency band in the high frequency band of the antenna, effectively increase bandwidth of the antenna, and resolve a problem of how to cover high bandwidth when the antenna is relatively small.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and persons of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. The described embodiments are merely some but not all of the embodiments of the present disclosure. All other embodiments obtained by persons of ordinary skill in the art based on the embodiments of the present disclosure without creative efforts shall fall within the protection scope of the present disclosure.

Figure 1:
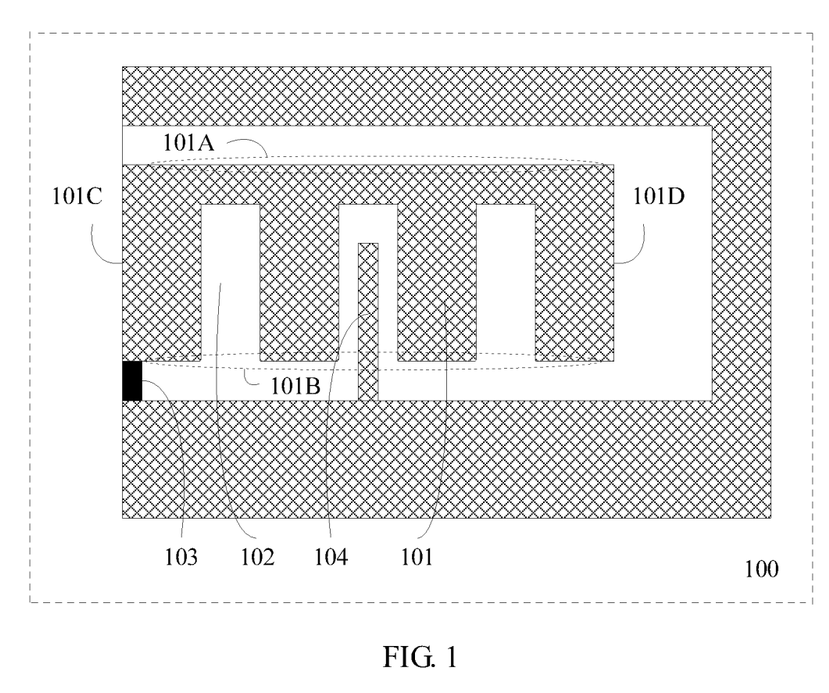
FIG. 1 is a schematic structural diagram of an antenna apparatus according to an embodiment of the present disclosure.

FIG. 1 is a schematic structural diagram of an antenna apparatus 100 according to an embodiment of the present disclosure. As shown in FIG. 1, the apparatus 100 in this embodiment may include: an antenna radiator 101, at least one antenna cable trough 102, a feedpoint 103, and at least one first protruding metal strip 104.

The at least one antenna cable trough 102 is disposed on the antenna radiator 101. The at least one antenna cable trough 102 extends along a top edge 101A to a bottom edge 101B of the antenna radiator 101. The feedpoint 103 is further disposed on the antenna radiator 101, and the feedpoint 103 is disposed at an end of the bottom edge 101B of the antenna radiator 101 and is near a side edge 101C of the antenna radiator 101. The at least one protruding metal strip 104 is inserted in a corresponding antenna cable trough 102, and is separated from the antenna radiator 101.

A length and a width of the antenna radiator 101 are set according to an actual requirement. This is not limited in this embodiment.

One or more antenna cable troughs 102 are disposed on the antenna radiator 101, and the antenna cable trough 102 extends along the top edge 101A to the bottom edge 101B of the antenna radiator 101. A function of the antenna cable trough 102 is to change a path, of a current, along which the current flows on the antenna radiator 101, and extend the path of the current, so as to shift a low-frequency resonance point of an antenna toward a lower frequency resonance point. In this way, in a case of a determined frequency band, a size of the antenna can be reduced to achieve miniaturization. Specifically, a quantity of antenna cable troughs 102 or the length or the width of the antenna cable trough 102 may be set according to an actual requirement. This is not limited in this embodiment.

The feedpoint 103 is further disposed in a position that is at the end of the bottom edge 101B of the antenna radiator 101 and that is near the side edge 101C of the antenna radiator 101.

Figure 2A:
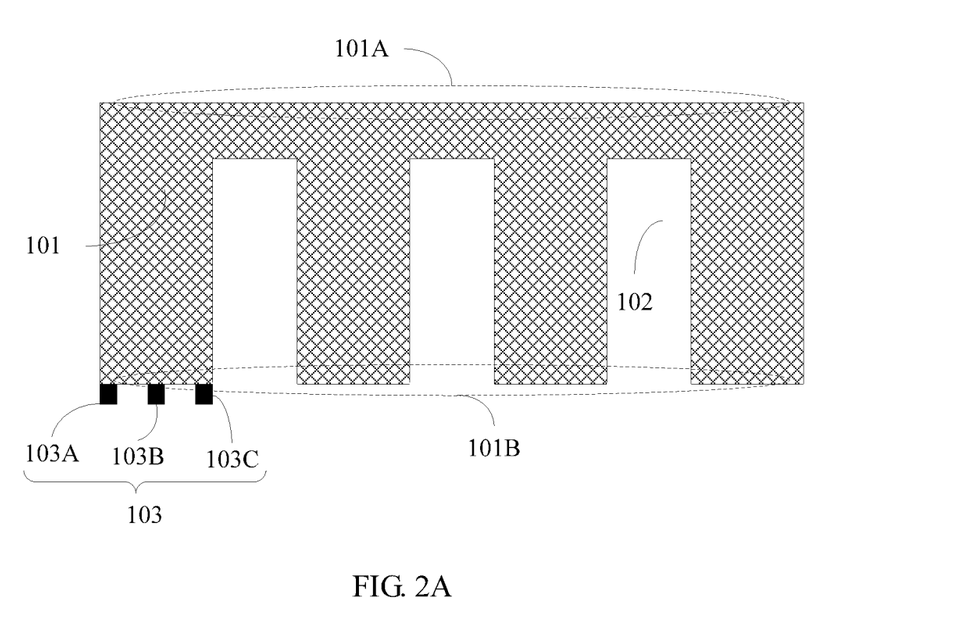
FIG. 2A is a schematic structural diagram of an antenna radiator and a feedpoint according to an embodiment of the present disclosure.

FIG. 2A is a schematic structural diagram of an antenna radiator 101 and a feedpoint 103 according to an embodiment of the present disclosure. As shown in FIG. 2A, an upper edge of the antenna radiator 101 is a top edge 101A, and a lower edge of the antenna radiator 101 is a bottom edge 101B. Three antenna cable troughs 102 divide the antenna radiator 101 into four strip areas. The bottom edge 101B of the antenna radiator 101 is divided into four disconnected segments by the three antenna cable troughs 102. The feedpoint 103 is disposed on a leftmost end of a lower part of the antenna radiator 101, that is, a leftmost end of the bottom edge 101B of the antenna radiator 101. A specific position is shown as a position of 103A, 103B, or 103C in FIG. 2A. The feedpoint 103 is disposed in such a manner to reduce an electromagnetic effect, caused by an antenna in operation, on another component around the antenna.

Figure 2B:
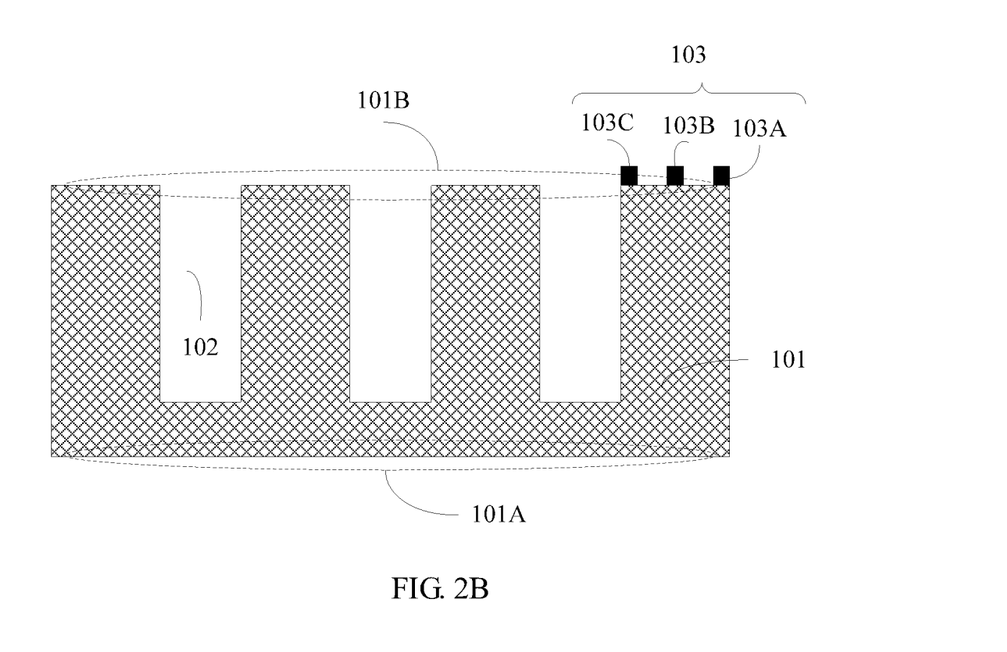
FIG. 2B is another schematic structural diagram of an antenna radiator and a feedpoint according to an embodiment of the present disclosure.

FIG. 2B is another schematic structural diagram of an antenna radiator 101 and a feedpoint 103 according to an embodiment of the present disclosure. As shown in FIG. 2B, an upper edge of the antenna radiator 101 is a bottom edge 101B, and a lower edge of the antenna radiator 101 is a top edge 101A. Three antenna cable troughs 102 divide the antenna radiator 101 into four strip areas. The bottom edge 101B of the antenna radiator 101 is divided into four disconnected segments by the three antenna cable troughs 102. The feedpoint 103 is disposed on a rightmost end of an upper part of the antenna radiator 101, that is, a rightmost end of the bottom edge 101B. A specific position is shown as a position of 103A, 103B, or 103C in FIG. 2B. The feedpoint 103 is disposed in such a manner to reduce an electromagnetic effect, caused by an antenna in operation, on another component around the antenna.

The at least one first protruding metal strip 104 is disposed in the antenna cable trough 102. Specifically, the first protruding metal strip 104 is inserted in the antenna cable trough 102 and is separated from the antenna radiator 101. The first protruding metal strip 104 can generate a new resonance point in a high frequency band of an antenna, so as to widen a frequency band in the high frequency band of the antenna and effectively increase bandwidth of the antenna. A quantity of first protruding metal strips 104 or a length or a width of the first protruding metal strip 104 may be set according to an actual requirement. This is not limited in this embodiment.

In this embodiment of the present disclosure, at least one antenna cable trough is disposed on an antenna radiator, and the at least one antenna cable trough can extend a path along which a current flows on the antenna radiator, and shift a low-frequency resonance point of an antenna toward a lower frequency. In this way, in a case of a determined frequency band, a size of the antenna can be reduced to achieve miniaturization. A feedpoint is disposed in a position that is at an end of a bottom edge of the antenna radiator and that is near a side edge of the antenna radiator. In addition, at least one first protruding metal strip is disposed in the antenna cable trough, and the at least one first protruding metal strip can enable the antenna to generate a new resonance point in a high frequency band, so as to widen a frequency band in the high frequency band of the antenna, effectively increase bandwidth of the antenna, and resolve a problem of how to cover high bandwidth when the antenna is relatively small.

Figure 3:
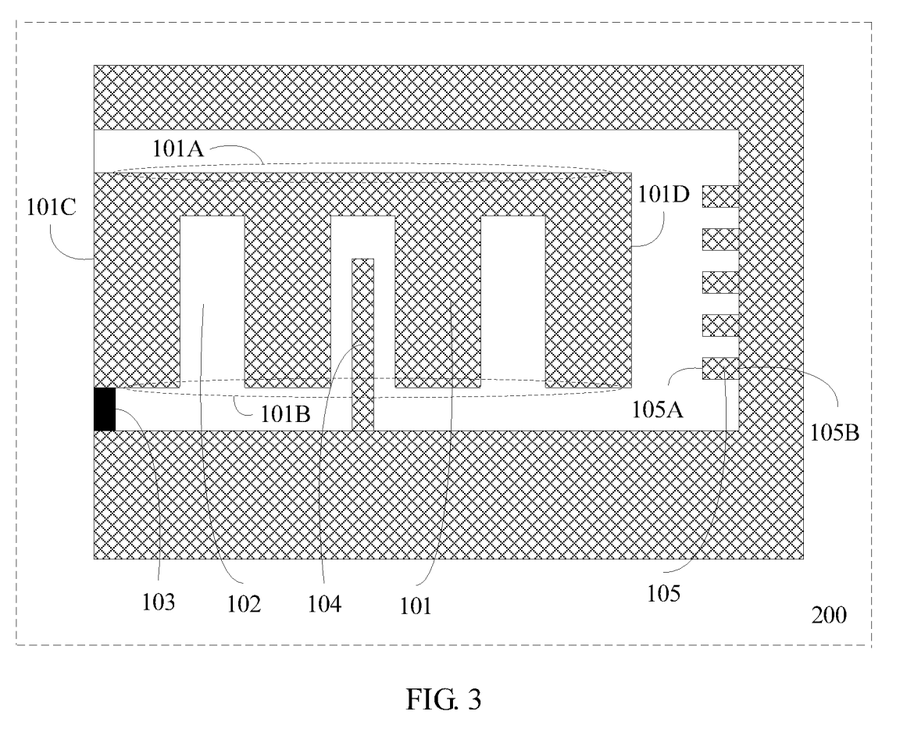
FIG. 3 is a schematic structural diagram of an antenna apparatus according to another embodiment of the present disclosure.

FIG. 3 is a schematic structural diagram of an antenna apparatus 200 according to another embodiment of the present disclosure. As shown in FIG. 3, on the basis of the antenna apparatus 100 shown in FIG. 1, the antenna apparatus 200 in this embodiment may further include at least one second protruding metal strip 105. The at least one second protruding metal strip 105 is disposed on another side edge 101D, far away from the feedpoint 103, of the antenna radiator 101. The at least one second protruding metal strip 105 is separated from the antenna radiator 101, and an end 105A of the at least one second protruding metal strip 105 points to the another side edge 101D of the antenna radiator 101. The at least one second protruding metal strip 105 is disposed in such a manner to extend a path along which a current that induces antenna resonance flows around the antenna radiator 101, and shift a low-frequency resonance point of an antenna toward a lower frequency. In this way, in a case of a determined frequency band, a size of the antenna can be further reduced to achieve miniaturization. A quantity of second protruding metal strips 105, a length or a width of the second protruding metal strip 105, and a distance between the second protruding metal strip 105 and the another side edge 101D of the antenna radiator 101 may be set according to an actual requirement. This is not limited in this embodiment.

Figure 4:
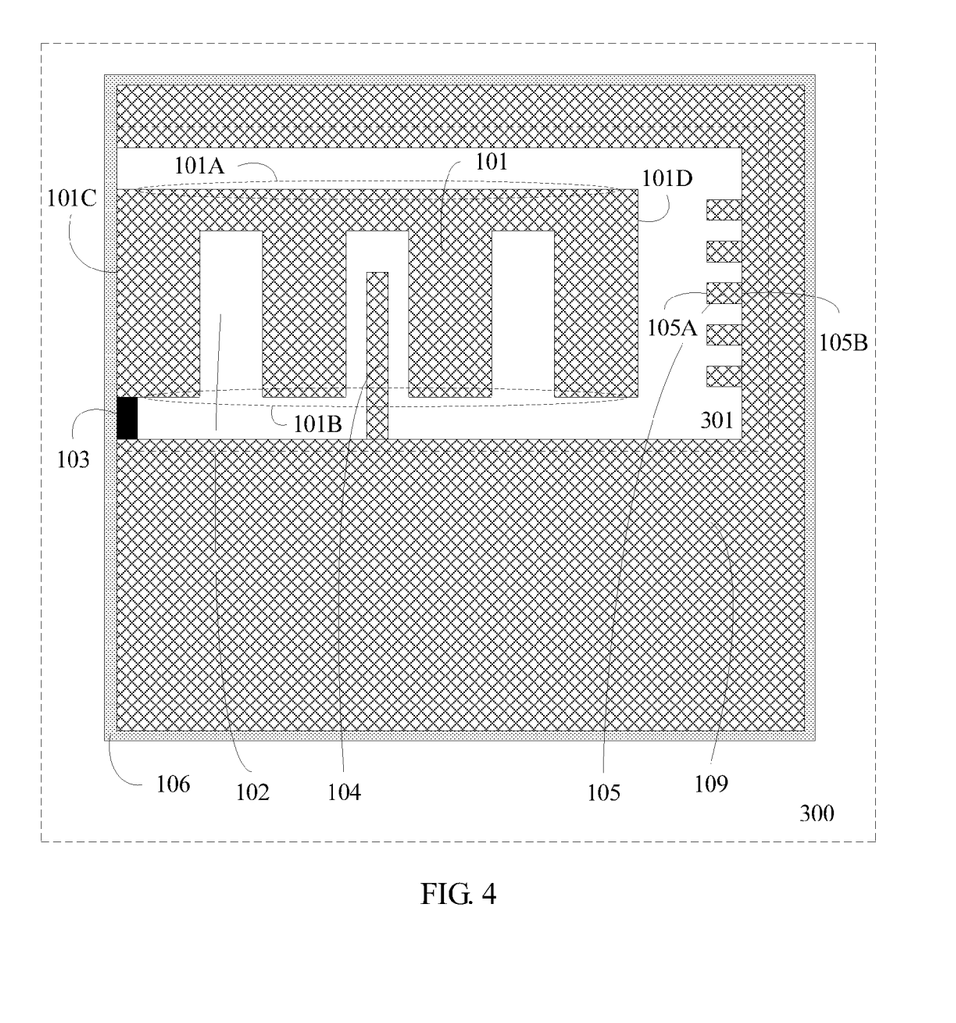
FIG. 4 is a schematic structural diagram of an antenna device according to an embodiment of the present disclosure.

FIG. 4 is a schematic structural diagram of an antenna device 300 according to an embodiment of the present disclosure. As shown in FIG. 4, the antenna device 300 in this embodiment may include a PCB 106. An antenna apparatus 301 is disposed in a position near an edge of the PCB 106, a PCB metal layer 109 is disposed around the antenna apparatus 301, and the PCB metal layer 109 is on the PCB 106.

The antenna apparatus 301 includes: an antenna radiator 101, at least one antenna cable trough 102, a feedpoint 103, and at least one first protruding metal strip 104.

The at least one antenna cable trough 102 is disposed on the antenna radiator 101. The at least one antenna cable trough 102 extends along a top edge 101A to a bottom edge 101B of the antenna radiator 101. The feedpoint 103 is further disposed on the antenna radiator 101, and the feedpoint 103 is disposed at an end of the bottom edge 101B of the antenna radiator 101 and is near a side edge 101C of the antenna radiator 101. The side edge 101C is near the edge of the PCB 106. The feedpoint 103 connects the antenna radiator 101 and the PCB metal layer 109. The at least one first protruding metal strip 104 is inserted in the antenna cable trough 102, and is separated from the antenna radiator 101. An end of the at least one first protruding metal strip 104 is connected to the PCB metal layer 109.

The antenna apparatus 301 is disposed in the position near the edge of the PCB 106, and the PCB metal layer 109 is disposed around the antenna apparatus and on the PCB 106. A length and a width of the antenna radiator 101 are set according to an actual requirement. This is not limited in this embodiment.

One or more antenna cable troughs 102 are disposed on the antenna radiator 101, and the antenna cable trough 102 extends along the top edge 101A to the bottom edge 101B of the antenna radiator 101. A function of the antenna cable trough 102 is to change a path, of a current, along which the current flows on the antenna radiator 101, and extend the path of the current, so as to shift a low-frequency resonance point of an antenna toward a lower frequency. In this way, in a case of a determined frequency band, a size of the antenna can be reduced to achieve miniaturization. Specifically, a quantity of antenna cable troughs 102 or a length or a width of the antenna cable trough 102 may be set according to an actual requirement. This is not limited in this embodiment.

The feedpoint 103 is further disposed in a position that is at the end of the bottom edge 101B of the antenna radiator 101 and that is near the side edge 101C of the antenna radiator 101. The feedpoint 103 connects the antenna radiator 101 and the PCB metal layer 109. Specifically, the feedpoint 103 is disposed at a leftmost end of a lower part of the antenna radiator 101, that is, a leftmost end of the bottom edge 101B of the antenna radiator 101, as shown in FIG. 4. The feedpoint 103 is disposed in such a manner to reduce an electromagnetic effect, caused by an antenna in operation, on another component around the antenna. In addition, the side edge 101C of the antenna radiator 101 is near the edge of the PCB 106.

The at least one first protruding metal strip 104 is disposed in the antenna cable trough 102. Specifically, the first protruding metal strip 104 is inserted in the antenna cable trough 102 and is separated from the antenna radiator 101. An end of the first protruding metal strip 104 is connected to the PCB metal layer 109. The first protruding metal strip 104 can generate a new resonance point in a high frequency band of an antenna, so as to widen a frequency band in the high frequency band of the antenna and effectively increase bandwidth of the antenna. A quantity of first protruding metal strips 104 or a length or a width of the first protruding metal strip 104 may be set according to an actual requirement. This is not limited in this embodiment.

On the basis of the foregoing embodiment, at least one second protruding metal strip 105 is further included. The at least one second protruding metal strip 105 is disposed on another side edge 101D, far away from the feedpoint 103, of the antenna radiator 101. The at least one second protruding metal strip 105 is separated from the antenna radiator 101, and an end 105A of the at least one second protruding metal strip 105 points to the another side edge 101D of the antenna radiator 101. The other end 105B of the at least one second protruding metal strip 105 is connected to the PCB metal layer 109. The at least one second protruding metal strip 105 is disposed in such a manner to extend a path along which a current that induces antenna resonance flows around the antenna radiator 101, and shift a low-frequency resonance point of an antenna toward a lower frequency. In this way, in a case of a determined frequency band, a size of the antenna can be further reduced to achieve miniaturization. A quantity of second protruding metal strips 105, a length or a width of the second protruding metal strip 105, and a distance between the second protruding metal strip 105 and the another side edge 101D of the antenna radiator 101 may be set according to an actual requirement. This is not limited in this embodiment.

Further, at least one PCB trough 107 is disposed in an edge, opposite to an opening of the antenna cable trough 102, on the PCB metal layer 109. A function of the at least one PCB trough 107 is also to extend the path along which the current that induces antenna resonance flows around the antenna radiator 101, and shift the low-frequency resonance point of the antenna toward the lower frequency. In this way, in the case of a determined frequency band, the size of the antenna can be further reduced to achieve miniaturization.

In this embodiment of the present disclosure, at least one antenna cable trough is disposed on an antenna radiator, a feedpoint is further disposed in a position that is at an end of a bottom edge of the antenna radiator and that is near a side edge of the antenna radiator, and the feedpoint connects the antenna radiator and a PCB metal layer. At least one first protruding metal strip is disposed in the antenna cable trough. In addition, at least one second protruding metal strip is disposed in another side edge, far away from the feedpoint, of the antenna radiator. At least one PCB trough is disposed in an edge, opposite to an opening of the antenna cable trough, on the PCB metal layer. The at least one antenna cable trough, the at least one second protruding metal strip, and the at least one PCB trough are disposed in such a manner to extend paths along which a current that induces antenna resonance flows on the antenna radiator and around the antenna radiator, and shift a low-frequency resonance point of an antenna toward a lower frequency. In this way, in a case of a determined frequency band, a size of the antenna can be reduced to achieve miniaturization. Further, the at least one first protruding metal strip is disposed in the at least one antenna cable trough, which can enable the antenna to generate a new resonance point in a high frequency band, so as to widen a frequency band in the high frequency band of the antenna, effectively increase bandwidth of the antenna, and resolve a problem of how to cover high bandwidth when the antenna is relatively small.

Figure 5:
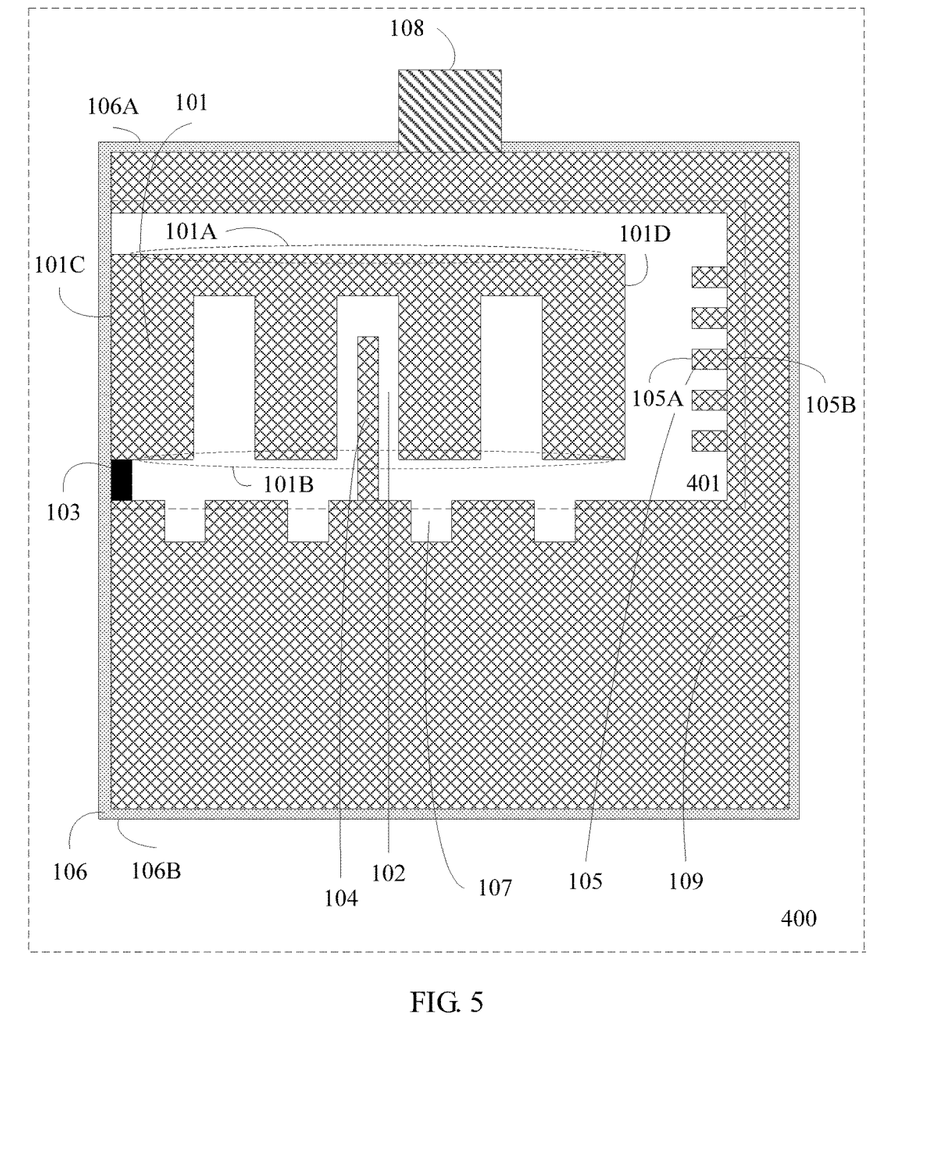
FIG. 5 is a schematic structural diagram of an antenna device according to another embodiment of the present disclosure.

FIG. 5 is a schematic structural diagram of an antenna device 400 according to another embodiment of the present disclosure. As shown in FIG. 5, this embodiment provides a solution and a structure of a new miniaturized printed antenna in a Universal Serial Bus (USB) product, so that an antenna can operate in three frequency bands: 700-960 megahertz (MHz); 1,400-1,600 MHz; and 1,710-2,700 MHz.

In the USB interface product, the antenna is printed on a PCB 106 near a USB head 108. A length of the antenna (from a side edge 101C of an antenna radiator 101 to an end 105A of a second protruding metal strip 105) is 10 millimeters (mm), and a length of the PCB 106 (from a top edge 106A to a bottom edge 106B of the PCB 106) is 25 mm. Three antenna cable troughs 102 are disposed on the antenna radiator 101, and the three antenna cable troughs 102 extend along a top edge 101A to a bottom edge 101B of the antenna radiator 101, that is, an opening direction is opposite to a direction of the USB head 108. The three antenna cable troughs 102 are used to extend a path of a current that induces antenna resonance, shift a low-frequency resonance point of the antenna toward a lower frequency band, and reduce a low-frequency resonance point of the antenna without increasing a size of the antenna, so as to achieve miniaturization of the antenna.

The feedpoint 103 is further disposed in a position that is at an end of the bottom edge 101B of the antenna radiator 101 and that is near the side edge 101C of the antenna radiator 101. The feedpoint 103 connects the antenna radiator 101 and the PCB metal layer 109. Specifically, the feedpoint 103 is disposed at a leftmost end of a lower part of the antenna radiator 101, that is, a leftmost end of the bottom edge 101B of the antenna radiator 101, as shown in FIG. 5. The feedpoint 103 is disposed in such a manner to reduce an electromagnetic effect, caused by an antenna in operation, on another component around the antenna. In addition, the side edge 101C of the antenna radiator 101 is near an edge of the PCB 106.

A first protruding metal strip 104 is disposed in a middle antenna cable trough 102 in the three antenna cable troughs 102. Specifically, the first protruding metal strip 104 is inserted in the middle antenna cable trough 102 and is separated from the antenna radiator 101. An end of the first protruding metal strip 104 is connected to the PCB metal layer 109. The first protruding metal strip 104 can generate a new resonance point in a high frequency band of the antenna, so as to widen a frequency band in the high frequency band of the antenna and effectively increase bandwidth of the antenna.

Five second protruding metal strips 105 are disposed in another side edge 101D, far away from the feedpoint 103, of the antenna radiator 101. Specifically, the five second protruding metal strips 105 are separated from the antenna radiator 101. An end 105A of each of the five second protruding metal strips 105 points to the another side edge 101D of the antenna radiator 101, and the other end 105B is connected to the PCB metal layer 109. The five second protruding metal strips 105 may extend a path along which a current that induces antenna resonance flows around the antenna radiator 101, and shift the low-frequency resonance point of the antenna toward the lower frequency band. In this way, in a case of a determined frequency band, the size of the antenna can be further reduced to achieve miniaturization.

Further, four PCB troughs 107 are disposed in an edge, opposite to an opening of the antenna cable trough 102, on the PCB metal layer 109. A function of the four PCB troughs 107 is also to extend the path along which the current that induces antenna resonance flows around the antenna radiator 101, and shift the low-frequency resonance point of the antenna toward the lower frequency band. In this way, in the case of a determined frequency band, the size of the antenna can be further reduced to achieve miniaturization.

In this embodiment of the present disclosure, in a USB interface product, an antenna is printed, near a USB, on a PCB; three antenna cable troughs are disposed on an antenna radiator; a feedpoint is further disposed in a position that is at an end of a bottom edge of the antenna radiator and that is near a side edge of the antenna radiator, and the feedpoint connects the antenna radiator and a PCB metal layer; a first protruding metal strip is disposed in a middle antenna cable trough in the three antenna cable troughs; in addition, five second protruding metal strip are disposed on another side edge, far away from the feedpoint, of the antenna radiator; and four PCB troughs are disposed on an edge, opposite to openings of the antenna cable troughs, on the PCB metal layer. The three antenna cable troughs, the five second protruding metal strips, and the four PCB troughs are disposed in such as manner to extend paths along which a current that induces antenna resonance flows on the antenna radiator and around the antenna radiator, and shift a low-frequency resonance point of an antenna toward a lower frequency band. In this way, in a case of a determined frequency band, a size of the antenna can be reduced to achieve miniaturization. In addition, the first protruding metal strip is disposed in the middle antenna cable trough in the three antenna cable troughs, which can generate a new resonance point in a high frequency band for the antenna, so as to widen a frequency band in the high frequency band of the antenna, effectively increase bandwidth of the antenna, and resolve a problem of how to cover high bandwidth when the antenna is relatively small. A structure of an antenna apparatus is designed in the USB interface product, so as to implement, on a premise of a small terminal, an operation requirement for multiple frequency bands and a wide frequency band in the antenna apparatus built in the terminal, for example, covering three frequency bands including 700-960 MHz, 1,400-1,600 MHz, and 1,710-2,700 MHz, and effectively resolving a problem of how a small printed antenna can cover high bandwidth.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. An antenna apparatus comprising
an antenna radiator comprising a top edge, a bottom edge, and a first side edge, wherein the bottom edge comprises an end;
an antenna cable trough disposed on the antenna radiator and extending from the bottom edge to near the top edge;
a feedpoint disposed on the antenna radiator at the end and near the first side edge; and
a first protruding metal strip inserted in the antenna cable trough and separated from the antenna radiator,
wherein the antenna apparatus is configured to be disposed within a printed circuit board (PCB) metal layer.

2. The antenna apparatus of claim 1, wherein the antenna radiator further comprises a second side edge far away from the feedpoint.

3. The antenna apparatus of claim 2, further comprising a second protruding metal strip disposed in a position of the second side edge, extending in a direction pointing to the antenna radiator, and not connected to the antenna radiator.

4. A device comprising:
a printed circuit board (PCB) comprising an edge;
a PCB metal layer disposed on the PCB; and
an antenna apparatus disposed near the edge, disposed within the PCB metal layer, and comprising:
an antenna radiator comprising a top edge, a bottom edge, and a first side edge near the edge, wherein the bottom edge comprises a first end;
an antenna cable trough disposed on the antenna radiator and extending from the bottom edge to near the top edge;
a feedpoint disposed on the antenna radiator at the first end and near the first side edge, wherein the feedpoint connects the antenna radiator to the PCB metal layer; and
a first protruding metal strip inserted in the antenna cable trough, separated from the antenna radiator, and comprising a second end connected to the PCB metal layer.

5. The device of claim 4, wherein the antenna radiator further comprises a second side edge far away from the feedpoint.

6. The device of claim 5, wherein the antenna apparatus further comprises a second protruding metal strip disposed on the second side edge.

7. The device of claim 6, wherein the antenna cable trough comprises an opening, and wherein the device further comprises a PCB trough disposed in a position opposite to the opening and on the PCB metal layer.

8. A device comprising:
a printed circuit board (PCB) comprising an edge;
a PCB metal layer disposed on the PCB; and
an antenna apparatus disposed near the edge, disposed within the PCB metal layer, and comprising:
an antenna radiator comprising a top edge, a bottom edge, and a first side edge near the edge, wherein the bottom edge comprises a first end,
an antenna cable trough disposed on the antenna radiator and extending from the bottom edge to near the top edge,
a feedpoint disposed on the antenna radiator at the first end and near the first side edge, wherein the feedpoint connects the antenna radiator to the PCB metal layer,
a first protruding metal strip inserted in the antenna cable trough, separated from the antenna radiator, and comprising a second end connected to the PCB metal layer,
a second side edge far away from the feedpoint, and
a second protruding metal strip disposed on the second side edge and separated from the antenna radiator.

9. The device of claim 8, wherein the second protruding metal strip comprises a third end pointing to the antenna radiator.

10. The device of claim 9, wherein the second protruding metal strip comprises a fourth end connected to the PCB metal layer.

11. The device of claim 4, wherein the antenna cable trough comprises an opening, and wherein the device further comprises a PCB trough disposed in a position opposite to the opening and on the PCB metal layer.

* * * * *